US008680921B2

(12) United States Patent
Honda et al.

(10) Patent No.: US 8,680,921 B2
(45) Date of Patent: Mar. 25, 2014

(54) AMPLIFYING APPARATUS, TRANSMITTER, AND AMPLIFYING APPARATUS CONTROL METHOD

(75) Inventors: Hirotake Honda, Yokohama (JP);
Hiroaki Maeda, Yokohama (JP);
Yousuke Okazaki, Kawasaki (JP);
Yoshinobu Shizawa, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 55 days.

(21) Appl. No.: 13/426,187

(22) Filed: Mar. 21, 2012

(65) Prior Publication Data

US 2012/0299648 A1    Nov. 29, 2012

(30) Foreign Application Priority Data

May 26, 2011 (JP) ................. 2011-118337

(51) Int. Cl.
*H03G 3/20* (2006.01)
(52) U.S. Cl.
USPC .................. 330/136; 330/296; 455/127.1
(58) Field of Classification Search
USPC .................. 330/136, 296, 127; 455/127.1
See application file for complete search history.

(56) References Cited

U.S. PATENT DOCUMENTS

| 5,451,907 | A  * | 9/1995  | Keane et al. ............... 330/296 |
| 6,294,959 | B1 * | 9/2001  | MacMillan ................. 330/277 |
| 6,333,677 | B1 * | 12/2001 | Dening ..................... 330/296 |
| 6,788,150 | B2 * | 9/2004  | Joly et al. .................. 330/296 |
| 6,873,830 | B2   | 3/2005  | Katakura et al. |
| 6,946,911 | B2 * | 9/2005  | Yang et al. ................. 330/296 |
| 7,230,492 | B2 * | 6/2007  | Benelbar .................... 330/289 |
| 7,372,332 | B2 * | 5/2008  | Birkbeck ................... 330/296 |
| 8,089,313 | B2 * | 1/2012  | Chang et al. ............... 330/136 |

FOREIGN PATENT DOCUMENTS

| EP | 1115211     | 7/2001  |
| JP | 2001-36351  | 2/2001  |
| JP | 2001-148615 | 5/2001  |
| JP | 2001-320243 | 11/2001 |
| JP | 2010-74282  | 4/2010  |

* cited by examiner

*Primary Examiner* — Patricia Nguyen
(74) *Attorney, Agent, or Firm* — Fujitsu Patent Center

(57) ABSTRACT

A power amplifying apparatus has a GaN device for RF amplification, a GaN device for monitoring, an Idq detecting circuit, and a gate bias control (GBC) circuit. The GaN device for RF amplification amplifies an input signal to output the resultant. The GaN device for monitoring is an amplification device for monitoring an input/output signal of the GaN device for RF amplification. The Idq detecting circuit detects an output signal output by the GaN device for monitoring, corresponding to an input signal, which is diverged from the input signal to be input to the GaN device for RF amplification, and is input to the GaN device for monitoring. The gate bias control circuit controls a gate voltage to be applied to the GaN device for RF amplification in accordance with the output signal detected by the Idq detecting circuit.

7 Claims, 12 Drawing Sheets

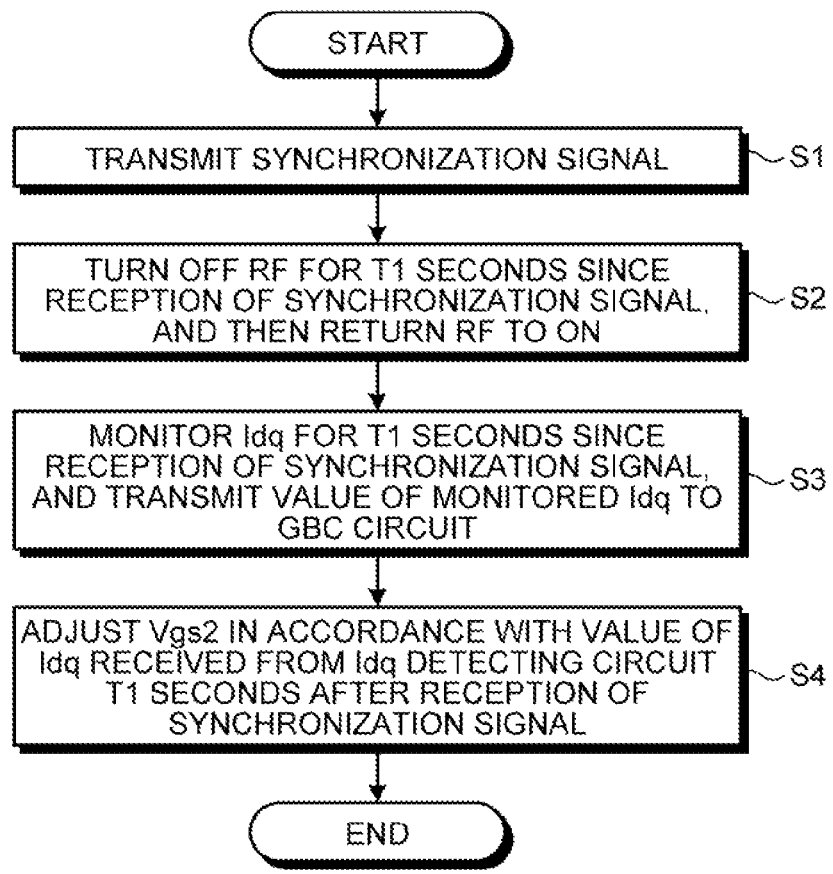

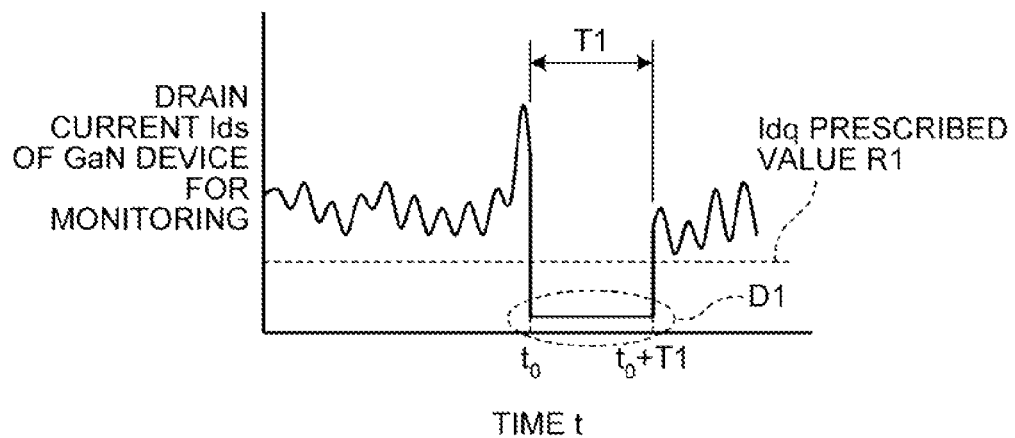
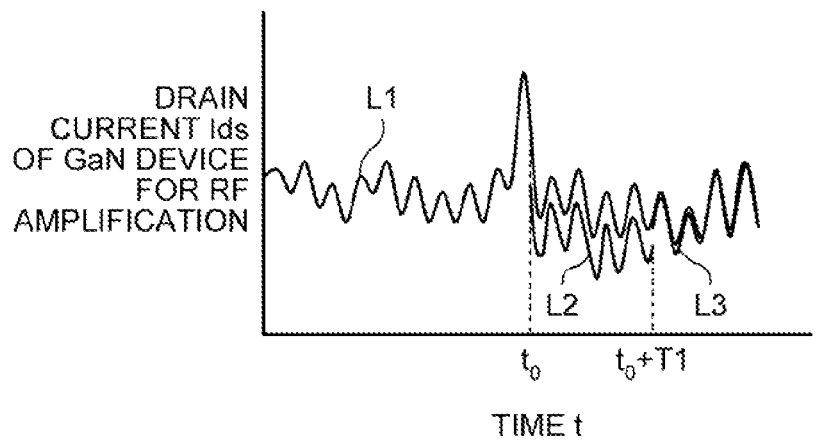

AMPLIFYING APPARATUS, TRANSMITTER, AND AMPLIFYING APPARATUS CONTROL METHOD

CROSS-REFERENCE TO RELATED APPLICATION

This application is based upon and claims the benefit of priority of the prior Japanese Patent Application No. 2011-118337, filed on May 26, 2011, the entire contents of which are incorporated herein by reference.

FIELD

The embodiments discussed herein are directed to an amplifying apparatus, a transmitter, and an amplifying apparatus control method.

BACKGROUND

Conventionally, with an increase in communication data amount in wireless communication, an increase in transmission output of a base station has been demanded. As an amplifying apparatus for high frequency and high output of the base station, a GaN (gallium nitride) device may be used. The GaN device has wider bandgap and higher mobility than another semiconductor device (Si-LDMOS, GaAs-FET), thus having excellent high frequency and high output characteristics.

FIG. 10 is a diagram illustrating a configuration of a power amplifying apparatus using a conventional GaN device. As illustrated in FIG. 10, a power amplifying apparatus 200 has an input terminal 201, a DC (Direct Current) block 202, a GaN device 203, a variable resistance 204, and a gate resistance 205. The power amplifying apparatus 200 has a power supply terminal 206, a coil 207, a capacitor 208, a DC block 209 and an output terminal 210. An RF (Radio Frequency) signal input to the input terminal 201 is input to a gate of the GaN device 203 through the DC block 202. In the gate of the GaN device 203, a voltage VG is divided by the variable resistance 204 to supply the resultant as a gate voltage Vgs through the gate resistance 205.

On the other hand, power is supplied to the power supply terminal 206. The power is applied to a drain of the GaN device 203 through the coil 207 for high frequency interruption. The power supply terminal 206 is grounded through the capacitor 208 for a DC voltage element. This removes a high-frequency interference component when the component is applied to the power supply terminal 206. Moreover, the RF signal amplified by the GaN device 203 is output to the output terminal 210 via the DC block 209.

FIG. 11A is a diagram illustrating a relationship between an input power and a drain current in the power amplifying apparatus using the conventional GaN device. In FIG. 11A, the input power is defined on an x axis, and the drain current on a y axis. As illustrated in FIG. 11A, the relationship is shown, in which a drain current Ids of the GaN device increases with an increase in the input power, differing from an idling current. Here, the drain current is a current flowing between the drain and a source of the GaN device 203 in a state where a DC (Direct Current) voltage (e.g., 50 V) is applied to the power supply terminal 206, and is expressed by "Ids" in the following description. Moreover, the idling current is the drain current in an idling state (in a state where the RF signal is not input), and is particularly expressed by "Idq" in the following description in order to distinguish the idling current from the drain current Ids at the normal time.

FIG. 11B is a diagram illustrating a relationship between the gate voltage and the drain current when the input power is 0. In FIG. 11B, the gate voltage is defined on an x axis, and the drain current on a y axis. As illustrated in FIG. 11B, when the input power is 0, the drain current Ids of the GaN device varies in accordance with an increase in the gate voltage Vgs. In the power amplifying apparatus 200, the gate voltage Vgs is set to a prescribed value by adjustment of the variable resistance 204 so that properties such as linearity and efficiency of an output signal become optimal.

Patent Literature 1: Japanese Laid-open Patent Publication No. 2001-320243
Patent Literature 2: Japanese Laid-open Patent Publication No. 2001-148615
Patent Literature 3: Japanese Laid-open Patent Publication No. 2010-74282
Patent Literature 4: Japanese Laid-open Patent Publication No. 2001-36351

In the power amplifying apparatus 200, the idling current Idg of the GaN device 203 is set to the prescribed value in advance by the adjustment of the variable resistance 204. However, since in the GaN device, there is a phenomenon of transient response of the drain current Ids, which is called Idq drift, the idling current Idg may largely fluctuate from the above-mentioned prescribed value, when the power amplifying apparatus 200 inputs the RF signal of the high power. The prescribed value is, for example, 400 mA to 800 mA.

FIG. 12A is a diagram illustrating chronological change in RF input signal intensity in the power amplifying apparatus using the conventional GaN device. In FIG. 12A, time t is defined on an x axis, and intensity of the RF input signal on a y axis. As illustrated in FIG. 12A, the RF signal of the high power is instantaneously input to the power amplifying apparatus 200 at time $t_4$. FIG. 12B is a diagram illustrating chronological change of the idling current in the power amplifying apparatus using the conventional GaN device. In FIG. 12B, the time t is defined on an x axis, and the idling current on a y axis. As illustrated in FIG. 12B, while the idling current Idq is set to the prescribed value before the input of the RF signal, the idling current Idq instantaneously increases with the input of the RF signal of the high power. Thereafter, the idling current Idq enters an Idq drift state, exhibiting a behavior of largely decreasing, for example, to about 10% of the Idq prescribed value, and gradually returning to the above-mentioned prescribed value as time has further elapsed (e.g., about several seconds to one hour).

With the above-described fluctuation of the idling current, a gain of the GaN device also fluctuates. The above-described gain fluctuation causes problems in performance deterioration of distortion compensation or operation complication in operation of the apparatus configured by combining the power amplifying apparatus and a distortion compensating circuit.

SUMMARY

According to an aspect of an embodiment of the invention, an amplifying apparatus includes a first amplification device; a second amplification device to monitor an input/output signal of the first amplification device; a detection circuit that detects an output signal output by the second amplification device, corresponding to an input signal, which is diverged from the input signal to be input to the first amplification device, and is input to the second amplification device; and a control circuit that controls a gate voltage to be applied to the first amplification device in accordance with the output signal detected by the detection circuit.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 3 is a diagram for describing main operation of the power amplifying apparatus according to the present embodiment;

FIG. 6A is a diagram illustrating a relationship between a drain current of a GaN device for monitoring and time;

FIG. 6B is a diagram illustrating a relationship between a drain current of a GaN device for RF amplification and time;

DESCRIPTION OF EMBODIMENTS

Preferred embodiments of the present invention will be explained with reference to accompanying drawings.

The following embodiments do not limit the amplifying apparatus, the transmitter, and the amplifying apparatus control method disclosed in the present application.

Figure 1:
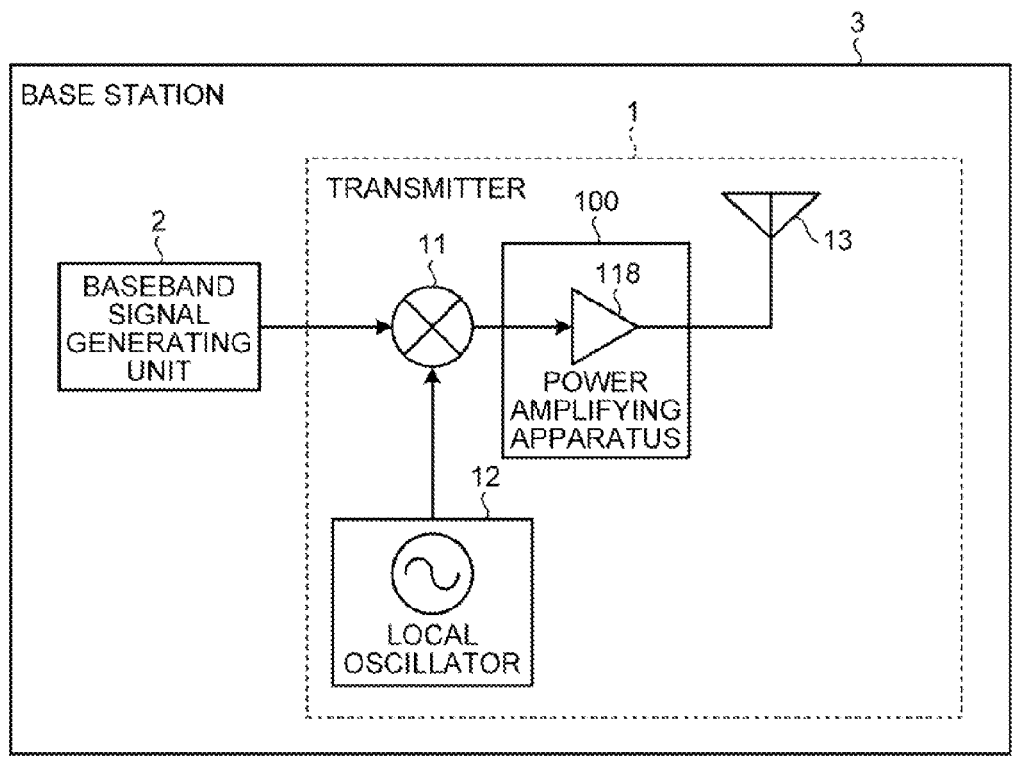
FIG. 1 is a diagram illustrating an overall configuration of a base station according to a present embodiment.

FIG. 1 is a diagram illustrating an overall configuration of a base station according to the present embodiment. As illustrated in FIG. 1, a base station 3 according to the present embodiment has a transmitter 1 that performs wireless communication, and a baseband signal generating unit 2 that performs signal control. The transmitter 1 has a power amplifying apparatus 100, a multiplier 11, a local oscillator 12, and an antenna 13. The transmitter 1 is installed, for example, in the base station. First, an overall configuration of the transmitter 1 according to the present embodiment will be described, using FIG. 1. Thereafter, gate voltage control in the power amplifying apparatus 100 according to the present embodiment will be described in detail.

The baseband signal generating unit 2 generates a baseband signal, based on input data such as an IP (Internet Protocol) packet and the like. The baseband signal generating unit 2 outputs the generated baseband signal to the transmitter 1. The baseband signal generating unit 2 is made up of, for example, a digital circuit, a DSP (Digital Signal Processor), a CPU (Central Processing Unit) and the like.

The multiplier 11 receives input of the baseband signal from the baseband signal generating unit 2. Furthermore, the multiplier 11 receives input of a local oscillation signal from the local oscillator 12. The multiplier 11 multiplies the baseband signal by a carrier frequency of the local oscillation signal to convert the frequency and generate an RF signal. The multiplier 11 outputs the generated RF signal to the power amplifying apparatus 100.

The power amplifying apparatus 100 has at least a GaN device for RF amplification 118 described later. While in FIG. 1, only one GaN device for RF amplification 118 is described, actually, plural GaN devices for RF amplification may be provided. The power amplifying apparatus 100 receives the input of the RF signal from the multiplier 11. The power amplifying apparatus 100 amplifies the RF signal by the GaN device for RF amplification 118. At this time, the power amplifying apparatus 100 performs adjustment processing of the idling current by the gate voltage control, details of which will be described. The power amplifying apparatus 100 transmits the amplified RF signal from the antenna 13.

Figure 2:
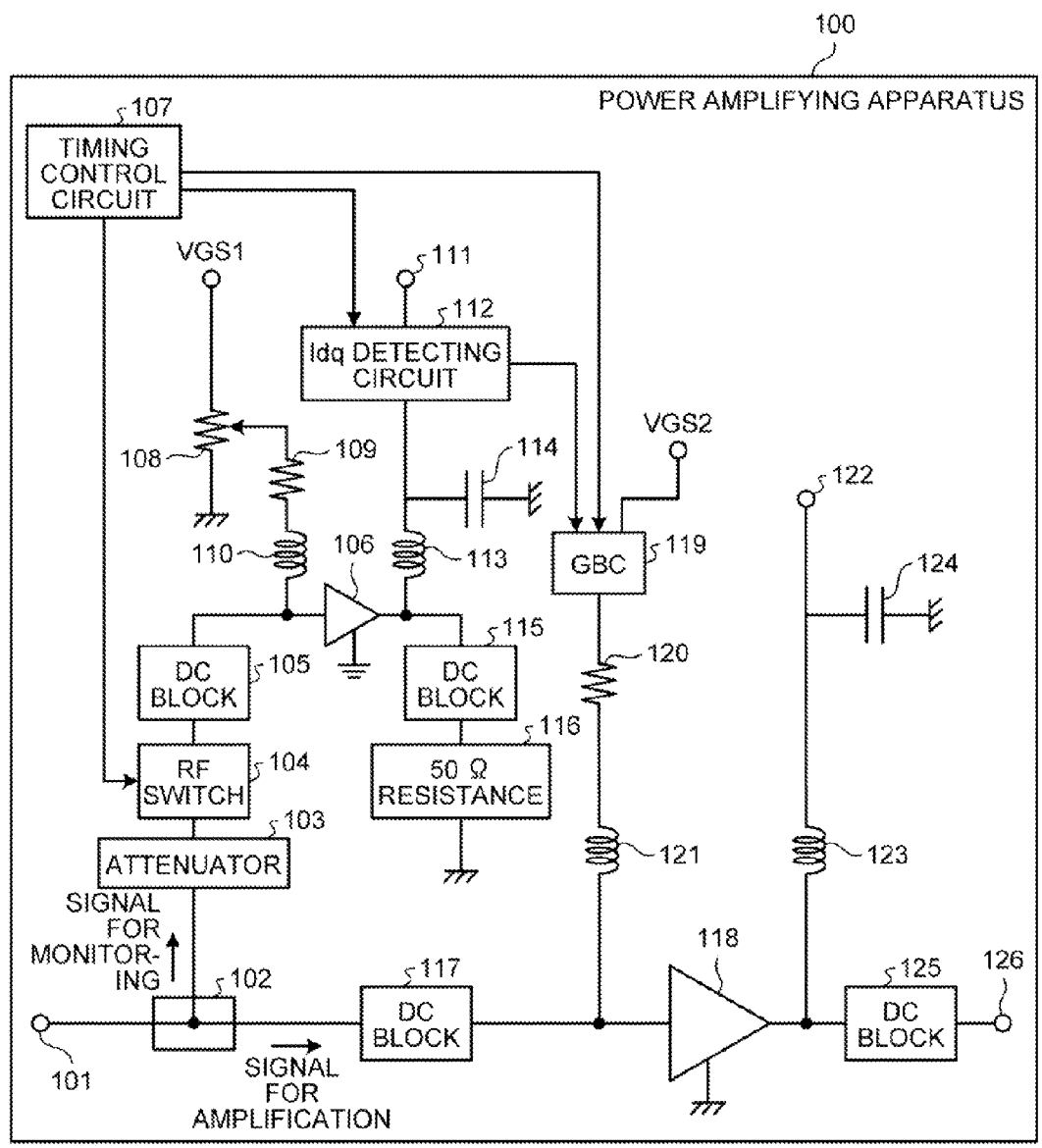
FIG. 2 is a diagram illustrating a configuration of a power amplifying apparatus according to the present embodiment.

FIG. 2 is a diagram illustrating a configuration of the power amplifying apparatus 100 according to the present embodiment. As illustrated in FIG. 2, the power amplifying apparatus 100 according to the present embodiment has an input terminal 101, a signal separator 102, an attenuator 103, an RF switch 104, a DC block 105, and a GaN device for monitoring 106. Moreover, the power amplifying apparatus 100 has a timing control circuit 107, a variable resistance 108, a gate resistance 109, a coil for high frequency interruption 110, a power supply terminal 111, an Idq detecting circuit 112, a coil for high frequency interruption 113, and a capacitor for DC voltage element 114. Furthermore, the power amplifying apparatus 100 has a DC block 115, a 50Ω resistance 116, a DC block 117, the GaN device for RF amplification 118, a gate bias control circuit (GBC: Gate Bias Controller) 119, and a gate resistance 120. Also, the power amplifying apparatus 100 has a coil for high frequency interruption 121, a power supply terminal 122, a coil for high frequency interruption 123, a capacitor for DC voltage element 124, a DC block 125, and an output terminal 126. These respective components are connected through signal lines so as to enable input/output of the signals unidirectionally or bidirectionally.

In the power amplifying apparatus 100, the RF signal input to the input terminal 101 is separated into an input signal for monitoring and an input signal for RF amplification by the signal separator 102. The input signal for monitoring is input to a gate of the GaN device for monitoring 106 through the attenuator 103, the RF switch 104, and the DC block 105.

The attenuator 103 adjusts RF input signal intensity to the GaN device for monitoring 106 to obtain an appropriate value in accordance with a device size ratio between the GaN device for monitoring 106 and the GaN device for RF amplification 118. For example, when the above-mentioned device size ratio is 1:N, the intensity of the signal for monitoring is adjusted so that the RF input signal intensity to the GaN device for monitoring 106 becomes 1/N of the RF input signal intensity to the GaN device for RF amplification 118.

Hereinafter, a specific description will be given, assuming a case where taking a case of N=100 as an example, the signal intensity of the RF input signal input to the input terminal 101 is 1.1, and a 10 dB coupler is used as the signal separator 102. The RF input signal with the signal intensity of 1.1 goes through the 10 dB coupler to thereby be separated into the signal for amplification with the signal intensity of 1.0 (0 dB), and the signal for monitoring before going through the attenuator 103 with the signal intensity of 0.1 (−10 dB). The signal for amplification with the signal intensity of 1.0 (0 dB) is supplied to the GaN device for RF amplification 118 through the DC block 117. On the other hand, the signal for monitoring with the signal intensity of 0.1 (−10 dB) goes through the attenuator 103 before being supplied to the GaN device for monitoring 106. In the attenuator 103, the signal intensity is adjusted so that intensity of an output signal from the attenuator 103 becomes 1/100 of the intensity of the above-mentioned signal for amplification. In this case, in the attenuator 103, the attenuation of 10 dB is performed, so that the signal intensity of the signal for monitoring output from the attenuator 103 becomes 0.01 (−20 dB). This allows the signals with the intensities suited for the device sizes of both the GaN devices 118, 106 to be input to the respective devices.

While in terms of maintaining high detection accuracy, it is desirable that the sizes of the two GaN devices 106, 118 are equivalent (1:1); however, the power amplifying apparatus 100 having the attenuator 103 at a previous stage of the RF switch 104, which enables a case where the device sizes are different to be easily addressed. That is, the above-described adjustment of an attenuation amount, the power amplifying apparatus 100 can detect and monitor a precise idling current Idq, which has been optimized. Accordingly, the power amplifying apparatus 100 can maintain the prescribed value of Idq at a high accuracy, even when the device sizes of the above-mentioned two GaN devices are different.

The RF switch 104 performs On/Off switching of the input of the RF signal to the GaN device for monitoring 106, based on a control signal input from the timing control circuit 107. A voltage VGS1, after being divided in the variable resistance 108, becomes a gate voltage Vgs1 through the gate resistance 109 and the coil for high frequency interruption 110 to be supplied to the gate of the GaN device for monitoring 106. On the other hand, the power is supplied to the power supply terminal 111, and the power is applied to a drain of the GaN device for monitoring 106 through the Idq detecting circuit 112 and the coil for high frequency interruption 113.

The Idq detecting circuit 112 detects the idling current Idq of the GaN device for monitoring 106. The Idq detecting circuit 112 detects Idq of the GaN device for monitoring 106 within predetermined time, based on the control signal input from the timing control circuit 107 to output a detection result to the gate bias control circuit 119. The Idq detecting circuit 112 is grounded through the capacitor for DC voltage element 114. This removes a high-frequency interference component when the component is applied to the Idq detecting circuit 112. The input signal for monitoring amplified by the GaN device for monitoring 106 is short-circuited to ground through the DC block 115 and the 50Ω resistance 116.

The input signal for RF amplification, after being output from the signal separator 102, is input to a gate of the GaN device for RF amplification 118 through the DC block 117. A voltage VGS2, after being subjected to voltage adjustment by the gate bias control circuit 119, becomes a gate voltage Vgs2 through the gate resistance 120 and the coil for high frequency interruption 121 to be supplied to the gate of the GaN device for RF amplification 118.

While Idq drift characteristics, that is, a fluctuation amount of the idling current Idq accompanying the input of the instantaneous high-power signal differs, depending on variation between lots of the GaN device (mono variation), an ambient temperature, the intensity of the RF signal and the like, the IDq drift characteristics can be matched between the devices. The GaN device for monitoring 106 and the GaN device for RF amplification 118 have the equivalent Idq drift characteristics with respect to the input signals in accordance with the device sizes, respectively. This allows the Idq detecting circuit 112 to monitor the drift characteristics in the input signal for monitoring as well, which drift characteristics are equivalent to the actual drift characteristics in the input signal for amplification in accordance with the device size. Accordingly, the Idq detecting circuit 112 can detect the idling current Idq at a high accuracy. As a result, the power amplifying apparatus 100 can maintain the idling current Idq at the prescribed value.

The gate bias control circuit 119 controls the gate voltage Vgs2, based on the signals input from the timing control circuit 107 and the Idq detecting circuit 112. The power is supplied to the power supply terminal 122 to be applied to a drain of the GaN device for RF amplification 118 through the coil for high frequency interruption 123. The power supply terminal 122 is grounded through the capacitor for DC voltage element 124. This removes a high-frequency interference component when the component is applied to the power supply terminal 122. The RF signal amplified by the GaN device for RF amplification 118 is output to the output terminal 126 through the DC block 125.

While the functional configuration of the power amplifying apparatus 100 has been described, the above-described respective components can be realized, for example, by elements and circuits described below. The DC blocks 105, 115, 117, 125 are realized by capacitors. The attenuator 103 is realized by combining plural resistances. The RF switch 104 is realized by combining an FET (Field Effect Transistor), a capacitor, and a resistance. The Idq detecting circuit 112 is realized by a fine resistance that converts a current value to a voltage value. The gate bias control circuit 119 is realized by combining a triangular wave generating circuit, a comparator (inversion comparator), a rectification circuit, and an inversion circuit. Particularly, the gate bias control circuit 119 generates a pulse from the triangular wave with an Idq detection voltage as a threshold, the Idq detection voltage being a voltage obtained by multiplying the idling current Idq detected by the Idq detecting circuit 112 by a predetermined resistance value. Thereafter, the gate bias control circuit 119 generates a gate voltage Vgs by amplifying and rectifying this pulse signal. Accordingly, the higher a frequency of the triangular wave is, the more responsiveness of the gate voltage control increases.

Next, operation will be described. FIG. 3 is a diagram for describing main operation of the power amplifying apparatus 100 according to the present embodiment.

Figure 4A:
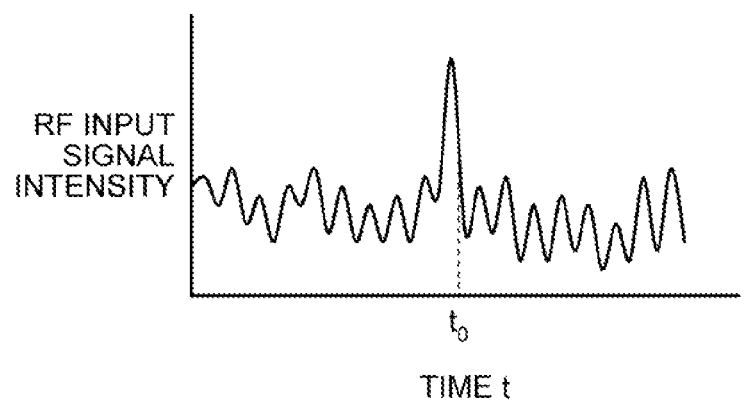
FIG. 4A is a diagram illustrating a relationship between RF input signal intensity and time.
Figure 4B:
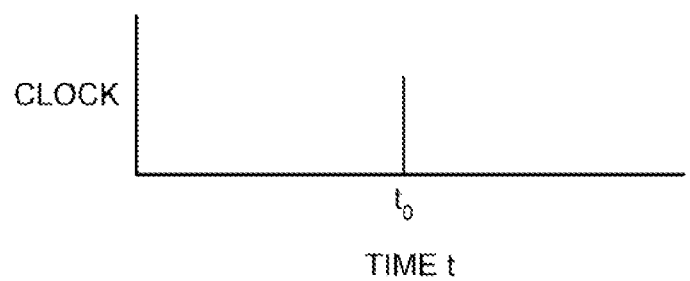
FIG. 4B is a diagram illustrating a relationship between a clock of a synchronization signal and time.

As illustrated in FIG. 3, in S1, the timing control circuit 107 outputs a synchronization signal to the RF switch 104, the Idq detecting circuit 112, and the gate bias control (GBC) circuit 119. For example, when a relationship between the RF input signal intensity, of which signal is input to the input terminal 101, and time is in a state illustrated in FIG. 4A, the timing control circuit 107 outputs the synchronization signal having a waveform illustrated in FIG. 4B.

Figure 5A:
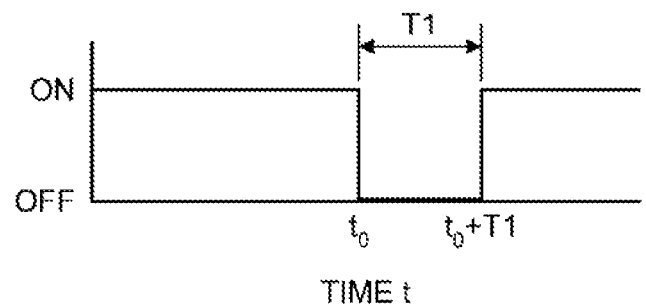
FIG. 5A is a diagram illustrating a relationship between a state of an RF switch and time.

When the synchronization signal is input from the timing control circuit 107, the RF switch 104 puts RF into an Off state for T1 seconds, and after the T1 seconds have passed, the RF switch 104 returns RF to an On state (S2). FIG. 5A is a diagram illustrating a relationship between the state of the RF switch 104 and time. As illustrated in FIG. 5A, the RF switch 104 shifts from the On state to the Off state at timing when the synchronization signal is input (refer to $t_0$ in FIG. 4B). The RF switch 104 again shifts to the On state after the time T1 has passed since $t_0$. The time T1 is enough time to detect and monitor the idling current Idq, and for example, several ms.

Moreover, when the synchronization signal is input from the timing control circuit 107, the Idq detecting circuit 112 monitors Idq until the above-mentioned T1 seconds have passed since the input to output a value of the Idq to the gate bias control circuit 119 (S3). Furthermore, when the synchronization signal is input from the timing control circuit 107, the gate bias control circuit 119 adjusts the gate voltage Vgs2 in accordance with the Idq value input from the Idq detecting circuit 112 after the above-mentioned T1 seconds have passed since the input (S4).

While in FIG. 5A, timing when the RF signal is turned off to detect and monitor the idling current Idq is the input time of the high-power signal, this timing is arbitrary, and for example, every constant cycle may be employed. Moreover, while timing when the gate bias control (GBC) circuit 119 controls the gate voltage of the GaN device for RF amplification 118 is arbitrary regardless of the On/Off state of the RF input signal.

Figure 5B:
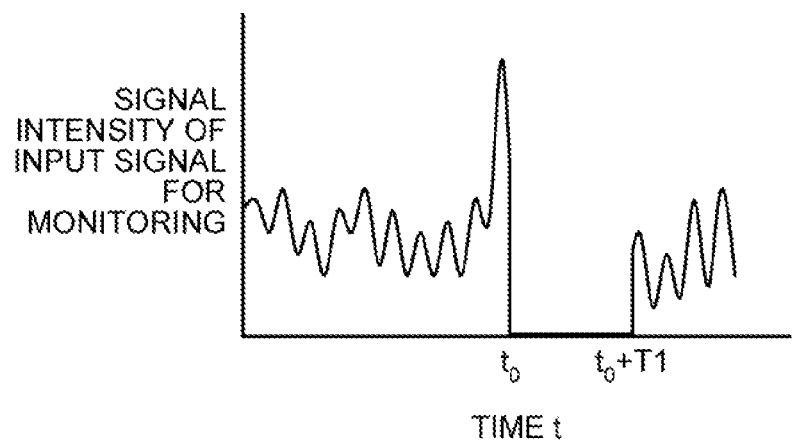
FIG. 5B is a diagram illustrating a relationship between signal intensity of an input signal for monitoring and time.

FIG. 5B is a diagram illustrating a relationship between the signal intensity of the input signal for monitoring and time. As illustrated in FIG. 5B, the intensity of the RF signal input to the GaN device for monitoring 106 becomes 0 at the time $t_0$ with the shift of the RF switch 104 to the Off state used as a moment. The signal intensity of the input signal for monitoring again exhibits a waveform similar to that of the signal intensity of the RF input signal (refer to FIG. 4A) input to the input terminal 101 with the return to the On state used as a moment.

FIG. 6A is a diagram illustrating a relationship between a drain current of the GaN device for monitoring 106 and time. As illustrated in FIG. 6A, a drain current Ids of the GaN device for monitoring 106 exhibits a value beyond a prescribed value R1 of the idling current Idq indicated by a dashed line while the RF switch 104 is in the On state. However, when the RF switch 104 is turned off at the time $t_0$, the drain current Ids exhibits a value significantly lower than the above-mentioned prescribed value R1 while the RF switch 104 is in the Off state (for the time T1). At time $t_0$+T1, when the RF switch 104 again returns to the On state, the drain current Ids of the GaN device for monitoring 106 exhibits a waveform similar to that of the original RF input signal. A region D1 in FIG. 6A is the drain current detected and monitored as the idling current Idq of the GaN device for monitoring 106 by the Idq detecting circuit 112 in the RF Off state. Before the gate voltage of the GaN device for RF amplification 118 is controlled by the gate bias control circuit 119 (before correction of the prescribed value), the idling current Idq in the region D1 has a value lower than the prescribed value R1.

Next, FIG. 6B is a diagram illustrating a relationship between the drain current of the GaN device for RF amplification 118 and time. In FIG. 6B, a waveform L1 indicates the drain current value Ids during the RF operation (the On state) when the idling current Idq is maintained at the prescribed value. A waveform L2 indicates the drain current value Ids when the drain current Ids during the RF operation and a gain fluctuates with a decrease in the idling current Idq. A waveform L3 indicates the drain current value Ids after the correction. As illustrated in FIG. 6B, although the value of the drain current Ids of the GaN device for RF amplification 118 decreases once at the time $t_0$ with the decrease in the idling current Idq, the value recovers to the original drain current value by the correction of the prescribed value of the idling current Idq (at the time $t_0$+T1). That is, the power amplifying apparatus 100 controls the gate voltage Vgs2 of the GaN device for RF amplification 118 to thereby correct the prescribed value of the idling current Idq, by which the fluctuation of the drain current Ids of the GaN device for RF amplification 118 is suppressed.

Figure 7A:
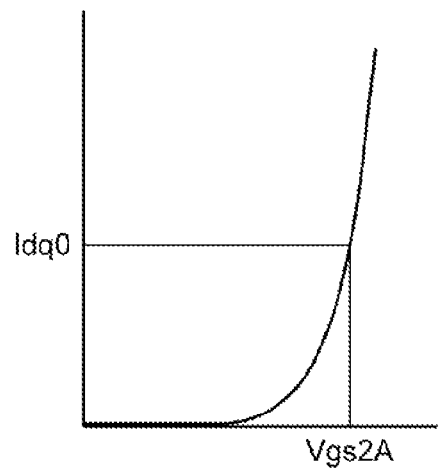
FIG. 7A is a diagram illustrating Vgs2-Idq characteristics in a normal state.
Figure 7B:
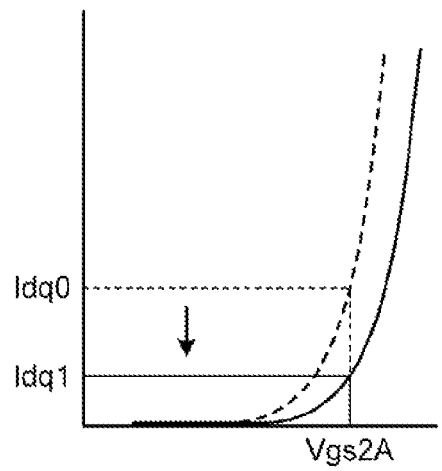
FIG. 7B is a diagram illustrating the Vgs2-Idq characteristics in an Idq drift state.
Figure 7C:
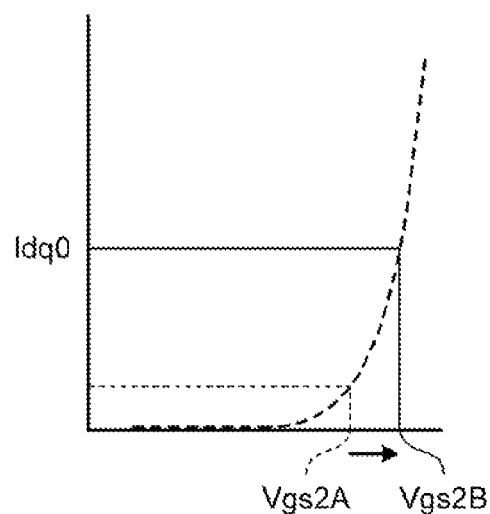
FIG. 7C is a diagram illustrating Vgs2 adjusted in the Idq drift state.

Here, how the gate voltage Vgs2 is adjusted by the gate bias control circuit 119 in the above-mentioned S4 will be described with reference to FIGS. 7A to 7C. The gate bias control circuit 119 adjusts the gate voltage Vgs2, based on Vgs2-Idq characteristics of the GaN device acquired in advance. FIG. 7A is a diagram illustrating the Vgs2-Idq characteristics in a normal state. In FIG. 7A, the gate voltage Vgs2 is defined on an x axis, and the idling current Idq on a y axis. As illustrated in FIG. 7A, in the normal state, at a predetermined gate voltage Vgs2A, the idling current Idq becomes a prescribed value Idq0. FIG. 7B is a diagram illustrating the Vgs2-Idq characteristics in an Idq drift state. As illustrated in FIG. 7B, in the Idq drift state, the idling current Idq decreases from Idq0 to Idq1 with fluctuation of a threshold (the gate voltage value Vgs2 when the drain current Ids of the GaN device is a predetermined value or lower). Consequently, the adjustment processing for returning this decreased Idq to the prescribed value is required. FIG. 7C is a diagram illustrating Vgs2 adjusted in the Idq drift state. The gate bias control circuit 119 adjusts the gate voltage Vgs2 until Idq becomes the above-mentioned prescribed value Idq0 in accordance with the fluctuation amount of the idling current Idq. As a result, as illustrated in FIG. 7C, the gate voltage Vgs2 is increased from Vgs2A corresponding to idq1 to Vgs2B corresponding to Idq0, which is the prescribed value.

As described above, the power amplifying apparatus 100 according to the present embodiment has the GaN device for RF amplification 118, the GaN device for monitoring 106, the Idq detecting circuit 112, and the gate bias control (GBC) circuit 119. The GaN device for RF amplification 118 amplifies the input signal to output the resultant. The GaN device for monitoring 106 is an amplification device for monitoring the input/output signal of the GaN device for RF amplification 118. The Idq detecting circuit 112 detects the output signal output by the GaN device for monitoring 106, corresponding to the input signal, which is diverged from the input signal to be input to the GaN device for RF amplification 118, and is input to the GaN device for monitoring 106. The gate bias control circuit 119 controls the gate voltage to be applied to the GaN device for RF amplification 118 in accordance with the output signal detected by the Idq detecting circuit 112.

More specifically, the power amplifying apparatus 100 has the GaN device for RF amplification 118, the GaN device for monitoring 106, the RF switch 104, the Idq detecting circuit 112, and the gate bias control circuit 119. The GaN device for RF amplification 118 amplifies the RF input signal to output the resultant. The GaN device for monitoring 106 has the drift characteristics regarding the idling current Idq in the GaN device for RF amplification 118, which is equivalent to those of the GaN device for RF amplification 118. The RF switch 104 has at least a part of the RF input signal input, and outputs the same to the GaN device for monitoring 106, thereby switching the presence and absence of the input of the RF input signal to the GaN device for monitoring 106. The Idq detecting circuit 112 detects and monitors the value of the idling current Idq when the input of the RF input signal to the GaN device for monitoring 106 is absent. The gate bias control circuit 119 controls the gate voltage Vgs2 to be applied to the GaN device for RF amplification 118 so that the value of the idling current Idq becomes the prescribed value, based on the value of the idling current Idq detected by the Idq detecting circuit 112.

In this manner, in the power amplifying apparatus 100, the GaN device for monitoring 106 is provided in addition to the GaN device for RF amplification 118 to detect and monitor the idling current Idq in the device. The power amplifying apparatus 100 controls the gate voltage Vgs2 to be applied to the GaN device for RF amplification 118, based on the detection result of the idling current Idq to thereby adjust the prescribed value of the idling current Idq in the GaN device for RF amplification 118. This allows the idling current Idq to be maintained at the prescribed value. That is, the power amplifying apparatus 100 monitors the idling current Idq of the device for monitoring, and controls the gate voltage of the device for RF amplification, based on the value, by which the current fluctuation due to the Idq drift is corrected, and the current is maintained at the prescribed value. Accordingly, the power amplifying apparatus 100 can suppress the fluctuation of the drain current Ids of the GaN device for RF amplification 118. As a result, the power amplifying apparatus 100 can reduce influence by the Idq drift phenomenon occurring when the high-power signal is input.

Figure 8A:
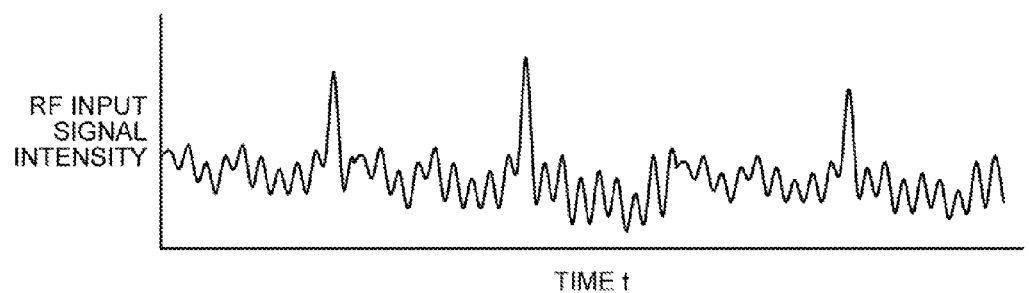
FIG. 8A is a diagram illustrating a relationship between the RF input signal intensity and time in a case where the synchronization signal is output in a predetermined cycle.
Figure 8B:
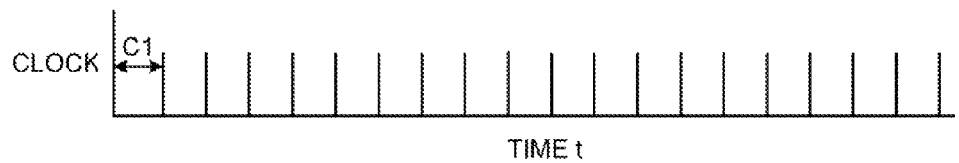
FIG. 8B is a diagram illustrating a relationship between the clock of the synchronization signal and time in a case where the synchronization signal is output in the predetermined cycle.
Figure 8C:
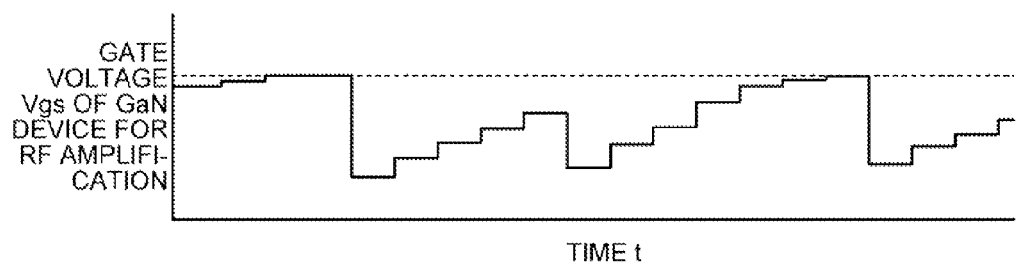
FIG. 8C is a diagram illustrating a relationship between a gate voltage of the GaN device for RF amplification and time in a case where the synchronization signal is output in the predetermined cycle.

Subsequently, referring to FIGS. 8A to 8C, a process in which the gate voltage Vgs of the GaN device for RF amplification 118 is controlled with the input of the synchronization signal will be described. In the following description, a case where the RF signal with the signal intensity as illustrated in FIG. 8A is input to the input terminal 101 is assumed. FIG. 8B is a diagram illustrating a relationship between a clock of the synchronization signal and time, in a case where the synchronization signal is output in a predetermined cycle C1. As illustrated in FIG. 8B, the timing control circuit 107 outputs a clock signal in the predetermined cycle C1, as the synchronization signal. This allows the gate voltage Vgs to be applied to the GaN device for RF amplification 118 to be controlled every predetermined cycle (clock cycle) C1 as the above-mentioned so as to return the detected idling current Idq to the prescribed value. As a result, the value of the gate voltage Vgs controlled in accordance with the clock signal comes to exhibit a waveform as illustrated in FIG. 8C.

That is, the power amplifying apparatus 100 further has the timing control circuit 107 that outputs the synchronization signal (the clock signal in the predetermined cycle) to the RF switch 104, the Idq detecting circuit 112, and the gate bias control circuit 119. The RF switch 104 brings about the state where the input of the input signal to the GaN device for monitoring 106 is absent (the RF Off state) for the predetermined time (e.g., T1) since the input of the synchronization signal. The Idq detecting circuit 112 detects and monitors the value of the idling current Idq for the predetermined time (e.g., T1) since the input of the synchronization signal. After the input of the above-mentioned synchronization signal, the gate bias control circuit 119 controls the gate voltage of the GaN device for RF amplification 118 so that the value of the idling current Idq becomes the predetermined value (e.g., 400 mA as the prescribed value), based on the detection result of the value of the idling current Idq by the Idq detecting circuit 112.

In the above-described case, the synchronization signal functions as a timing control signal to match the operation timing at the time of the clock signal input among the RF switch 104, the Idq detecting circuit 112, and the gate bias control circuit 119. The idling current Idq is detected when the input of the RF signal is off, and the power amplifying apparatus 100 uses the synchronization signal output in the predetermined clock cycle C1 as the timing control signal, so that the moment when the input of the RF signal is turned off comes periodically. This increases an opportunity to detect and monitor the idling current Idq. Accordingly, the gate bias control circuit 119 can correct the value of the idling current Idq without accompanying a large time lag. As a result, the idling current Idq is maintained at the prescribed value at a high accuracy.

Figure 9A:
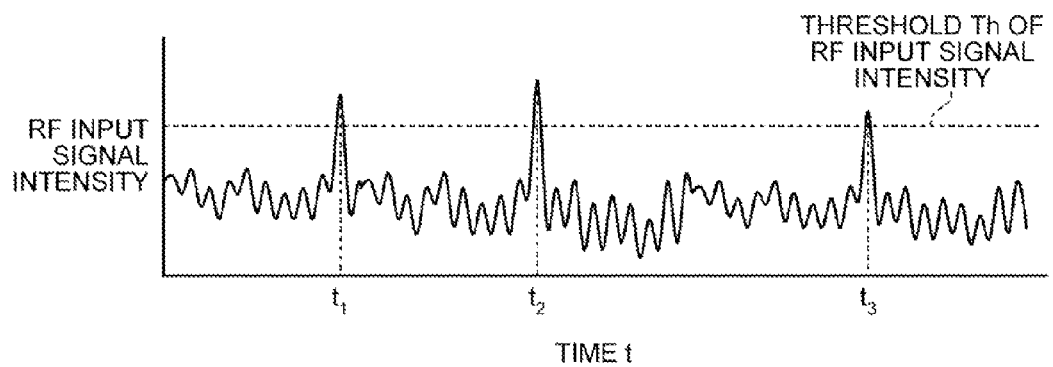
FIG. 9A is a diagram illustrating a relationship between the RF input signal intensity and time in a case where the synchronization signal is output when the RF input signal intensity is a predetermined value or more.
Figure 9B:
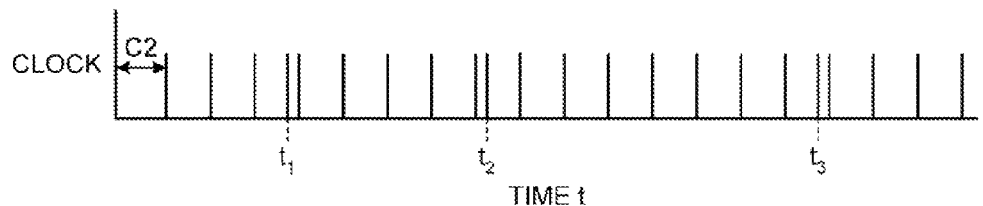
FIG. 9B is a diagram illustrating a relationship between the clock of the synchronization signal and time in a case where the synchronization signal is output when the RF input signal intensity is the predetermined value or more.
Figure 9C:
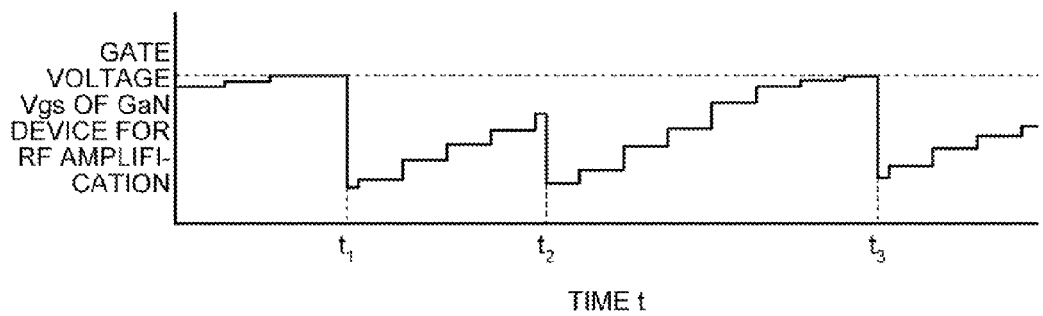
FIG. 9C is a diagram illustrating a relationship between the gate voltage of the GaN device for RF amplification and time in a case where the synchronization signal is output when the RF input signal intensity is the predetermined value or more.
Figure 10:
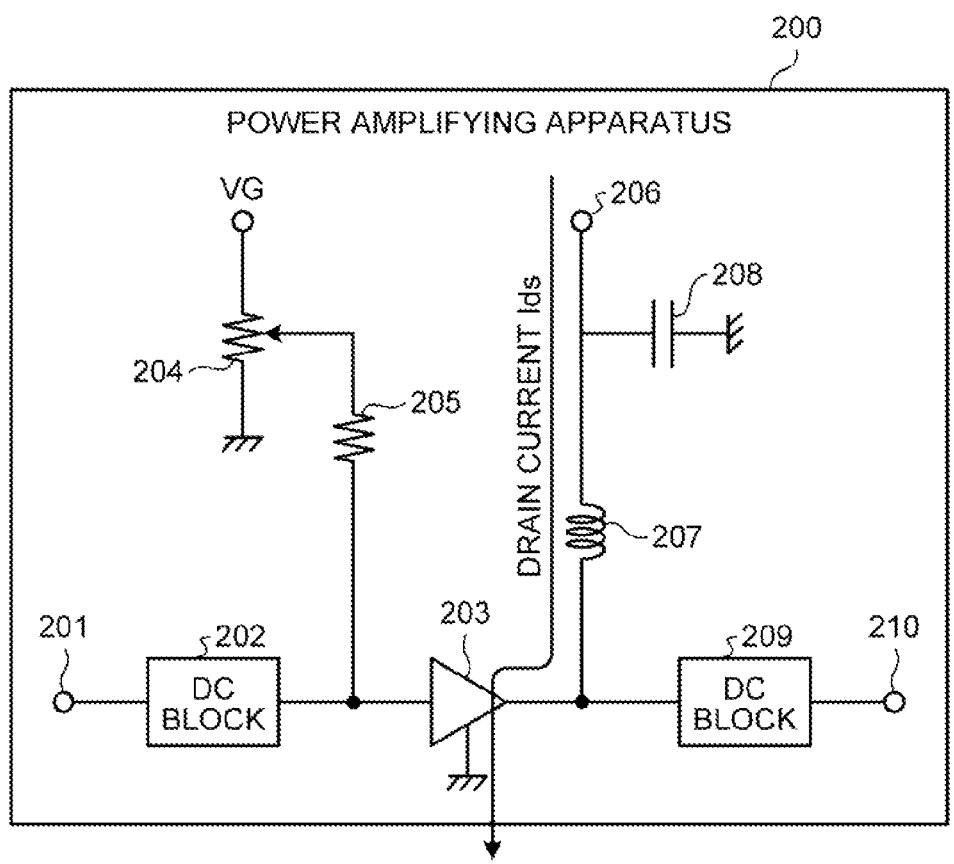
FIG. 10 is a diagram illustrating a configuration of a power amplifying apparatus using a conventional GaN device.
Figure 11A:
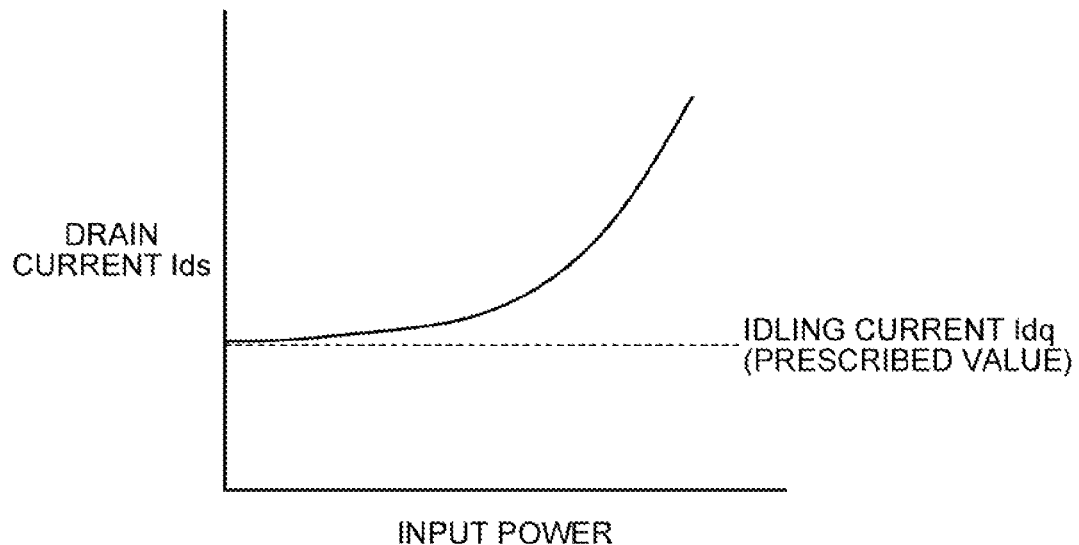
FIG. 11A is a diagram illustrating a relationship between an input power and a drain current in the power amplifying apparatus using the conventional GaN device.
Figure 11B:
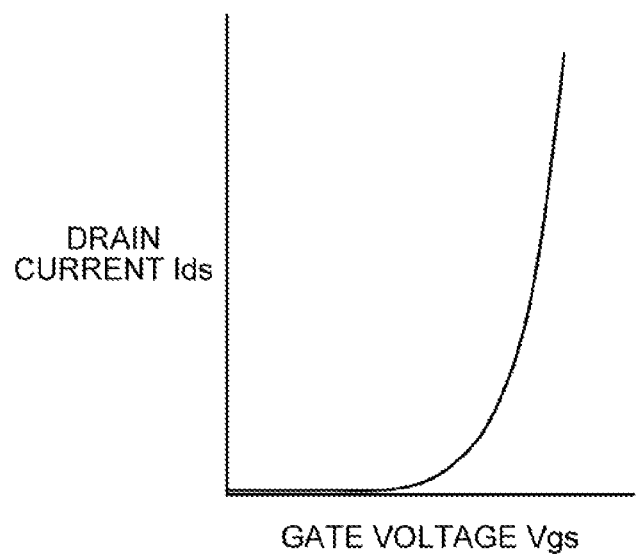
FIG. 11B is a diagram illustrating a relationship between a gate voltage and a drain current when the input power is 0.
Figure 12A:
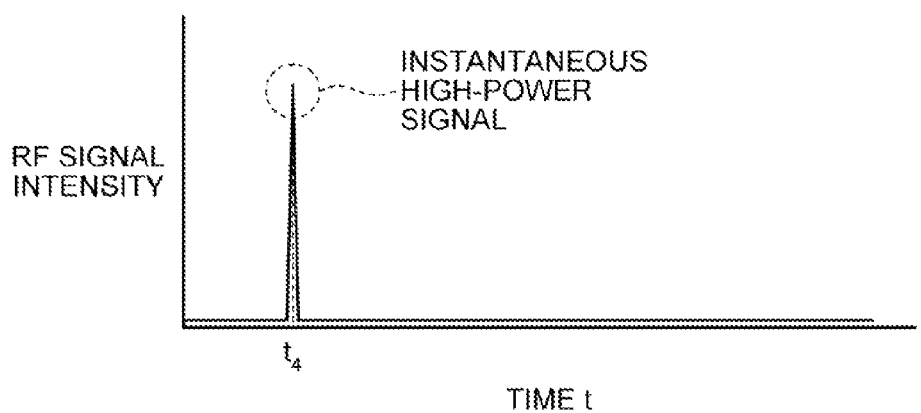
FIG. 12A is a diagram illustrating chronological change in the RF input signal intensity in the power amplifying apparatus using the conventional GaN device.
Figure 12B:
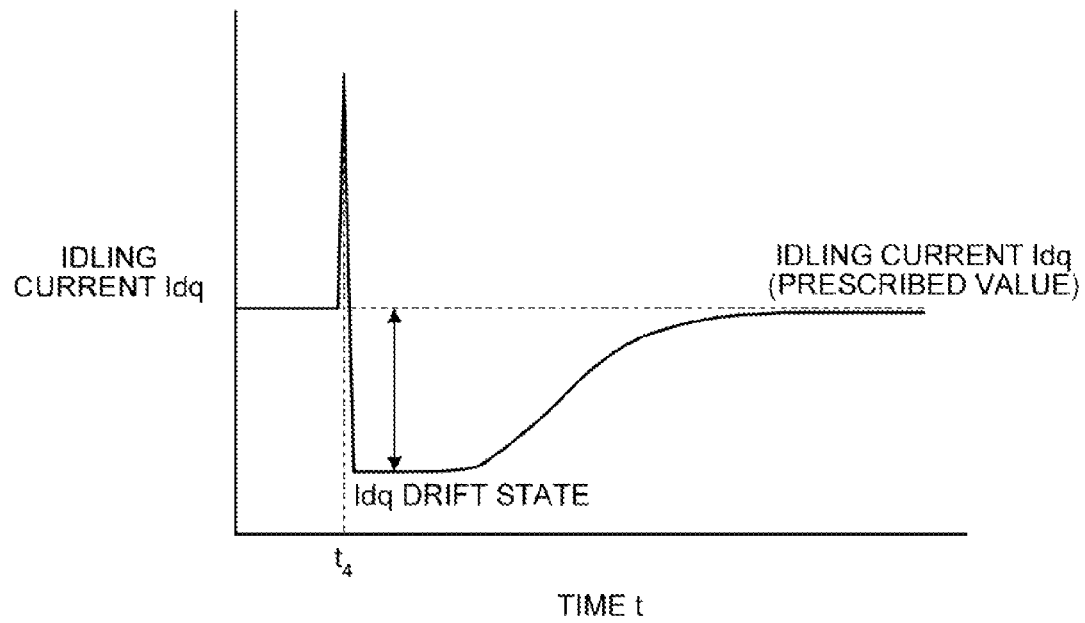
FIG. 12B is a diagram illustrating chronological change of an idling current in the power amplifying apparatus using the conventional GaN device.

Next, referring to FIGS. 9A to 9C, still another processing in which the gate voltage Vgs of the GaN device for RF amplification 118 is controlled with the input of the synchronization signal will be described. In the following description, a case where the RF signal with the signal intensity as illustrated in FIG. 9A is input to the input terminal 101 is assumed. In FIG. 9A, a threshold Th is set as the RF input signal intensity, and at three points of time $t_1$, $t_2$, $t_3$, the RF input signal intensity exceeds the threshold Th. FIG. 9B is a diagram illustrating a relationship between the clock of the synchronization signal and time in a case where the synchronization signal is output when the RF input signal intensity is the predetermined value or more. As illustrated in FIG. 9B, the timing control circuit 107 outputs the synchronization signal at the time $t_1$, $t_2$, $t_3$ in addition to the clock signal in a predetermined cycle C2. This enables the gate bias control circuit 119 to control the gate voltage Vgs of the GaN device for RF amplification 118 so as to return the detected idling current Idq to the prescribed value at the time $t_1$, $t_2$, $t_3$ as well in combination with the control at the intervals of the above-described predetermined cycle C2. As a result, the value of the gate voltage Vgs controlled in accordance with the synchronization signal exhibits a waveform as illustrated in FIG. 9C. In FIG. 9C, as compared with the waveform in FIG. 8C, at the time $t_1$, $t_2$, $t_3$ as well, the control of the gate voltage Vgs is started. This realizes the correction of the idling current Idq at an earlier stage.

That is, in the power amplifying apparatus 100, the timing control circuit 107 detects points when the signal intensity of the input signal becomes the predetermined value Th or more to output the synchronization signal that is synchronous with the input signal at the relevant points to the RF switch 104, the Idq detecting circuit 112, and the gate bias control circuit 119. In the above-described case, the synchronization signal functions as the timing control signal to match operation timing of the clock signal input and the high-power signal input (time $t_1$, $t_2$, $t_3$) among the RF switch 104, the Idq detecting circuit 112, and the gate bias control circuit 119. The idling current Idq is detected when the input of the RF signal is off, and the power amplifying apparatus 100 uses, as the timing control signal, not only the synchronization signal output in the predetermined clock cycle C2 but also the synchronization signal output when the input of the high-power signal is detected. Accordingly, the moment when the input of the RF signal is turned off also comes at the time of increase of the input signal intensity, when there is a high necessity of correcting the value of the idling current Idq to the prescribed value. This further increases the opportunity to detect and monitor the idling current Idq. Accordingly, when the high-power signal is input to the power amplifying apparatus 100, the gate bias control circuit 119 can immediately correct the value of the idling current Idq. As a result, time response characteristics to the Idq drift is further increased, which enables the power amplifying apparatus 100 to maintain the idling current Idq at the prescribed value at a high accuracy.

In the present embodiment, as to the timing when the timing control circuit 107 outputs the synchronization signal, the case has been exemplified, where the synchronization signal is output in the predetermined cycle as the clock signal, and is output at the points when the RF input signal intensity reaches the certain level or higher (e.g., at $t_1$, $t_2$, $t_3$ illustrated in FIGS. 9A to 9C). However, the timing control circuit 107 may output the synchronization signal not at both the above-mentioned timings but at any one of the timing.

According to one aspect of the amplifying apparatus disclosed by this application, the current (e.g., the idling current) can be maintained at the prescribed value.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifying apparatus comprising:
a first amplification device;
a second amplification device to monitor an input/output signal of the first amplification device;
a detection circuit that detects an output signal output by the second amplification device, corresponding to an input signal, which is diverged from the input signal to be input to the first amplification device, and is input to the second amplification device; and
a control circuit that controls a gate voltage to be applied to the first amplification device in accordance with the output signal detected by the detection circuit, wherein
the detection circuit monitors idling current until predetermined time to detect and monitor the idling current has passed since input of a synchronization signal to output a value of the idling current to the control circuit, and
the control circuit, when the synchronization signal is input, adjusts the gate voltage in accordance with the value of the idling current input from the detection circuit after the predetermined time has passed since the input.

2. The amplifying apparatus according to claim 1,
wherein the first amplification device amplifies the input signal to output the resultant,
the second amplification device has drift characteristics regarding a current, which are equivalent to those of the first amplification device,
the amplifying apparatus further comprises a switching circuit that switches presence or absence of input of the input signal to the second amplification device by inputting at least a part of the input signal to output to the second amplification device,
the detection circuit detects a value of the current when the input of the input signal to the second amplification device is absent, and
the control circuit controls the gate voltage to be applied to the first amplification device so that the value of the current becomes a predetermined value, based on the value of the current detected by the detection circuit.

3. The amplifying apparatus according to claim 2, further comprising a synchronization control circuit that outputs a synchronization signal to the switching circuit, the detection circuit, and the control circuit,
wherein the switching circuit brings about a state where the input of the input signal to the second amplification device is absent for a predetermined time since input of the synchronization signal,
the detection circuit detects the value of the current for the predetermined time since the input of the synchronization signal, and
the control circuit controls the gate voltage to be applied to the first amplification device after the input of the synchronization signal.

4. A transmitter comprising:
an amplifying apparatus having
a first amplification device,
a second amplification device to monitor an input/output signal of the first amplification device,
a detection circuit that detects an output signal output by the second amplification device, corresponding to an input signal, which is diverged from the input signal to be input to the first amplification device, and is input to the second amplification device, and
a control circuit that controls a gate voltage to be applied to the first amplification device in accordance with the output signal detected by the detection circuit; and
a transmission unit that transmits an output signal amplified by the amplifying apparatus, wherein
the detection circuit monitors idling current until predetermined time to detect and monitor the idling current has passed since input of a synchronization signal to output a value of the idling current to the control circuit, and
the control circuit, when the synchronization signal is input, adjusts the gate voltage in accordance with the value of the idling current input from the detection circuit after the predetermined time has passed since the input.

5. An amplifying apparatus control method in which a first amplification device amplifies an input signal and outputs the resultant, the method comprising:
detecting an output signal output by a second amplification device to monitor an input/output signal of the first amplification device, the output signal corresponding to an input signal, which is diverged from the input signal to be input to the first amplification device, and is input to the second amplification device; and controlling a gate voltage to be applied to the first amplification device in accordance with the detected output signal, wherein
the detecting includes monitoring idling current until predetermined time to detect and monitor the idling current has passed since input of a synchronization signal to output a value of the idling current to a control circuit, and
the controlling includes, when the synchronization signal is input, adjusting the gate voltage in accordance with the value of the idling current input at the detecting after the predetermined time has passed since the input.

6. The amplifying apparatus according to claim 2, further comprising a timing control circuit to detect points when signal intensity of the input signal becomes a predetermined value or more to output the synchronization signal that is synchronous with the input signal at the points to the switching circuit, the detection circuit, and the control circuit.

7. The amplifying apparatus according to claim 2, wherein
the drift characteristics are fluctuation amounts of the idling current accompanying the input of an instantaneous high-power signal and differ depending on variation between lots of each amplification device, an ambient temperature, and intensity of a Radio Frequency (RF) signal,
the first amplification device and the second amplification device have the equivalent drift characteristics with respect to input signals in accordance with sizes of the each amplification device, respectively, and
the detection circuit monitors the drift characteristics in the input signal for monitoring as well, which drift characteristics are equivalent to actual drift characteristics in the input signal for amplification in accordance with the device size.

* * * * *